March 9, 1965 W. B. STUHLER 3,172,294

SHAFT COUPLING ARRANGEMENT FOR MECHANICAL MODULES

Filed Feb. 6, 1961 2 Sheets-Sheet 1

INVENTOR.
WILLIAM B. STUHLER
BY Moody and Antrim
AGENTS

March 9, 1965 W. B. STUHLER 3,172,294

SHAFT COUPLING ARRANGEMENT FOR MECHANICAL MODULES

Filed Feb. 6, 1961 2 Sheets-Sheet 2

INVENTOR.
WILLIAM B. STUHLER
BY Moody and Antrim
AGENTS

United States Patent Office 3,172,294

Patented Mar. 9, 1965

3,172,294
SHAFT COUPLING ARRANGEMENT FOR MECHANICAL MODULES

William B. Stuhler, Garland, Tex., assignor to Collins Radio Company, Cedar Rapids, Iowa, a corporation of Iowa Filed Feb. 6, 1961, Ser. No. 87,496
2 Claims. (Cl. 74—1)

This invention pertains to couplers in radio tuning systems and particularly to couplers which are integral with gear systems for tuning radio modules.

As radio equipments which include replaceable modular units have become more compact, prior means of coupling the shafts of tunable radio modules must be modified to reduce their size, and the couplers and shafts must be arranged to facilitate alignment of the shafts in these equipments with closely spaced components. The system described herein combines the gear drive mechanism and the adjustable couplers into a compact arrangement that facilitates accurate alignment of tuning shafts.

The present system comprises a plurality of enmeshed gears with hubs rotatably mounted between a pair of closely spaced gear plates, certain ones of said gears and hubs being bored through for receiving tuning shafts, the shafts of the radio modules that are to be tuned by the gear assembly having split end portions which are to be inserted within the bores of the gears, screw expanding means for the split ends of the shafts, and the split end of each of said shafts and its screw expanding means being adapted to receive a coaxially positioned tuning tool and a locking tool respectively to facilitate locking the shaft to the inside wall of the bore of the respective gear while the shaft is retained in position by the tuning tool.

An object of the present invention is to facilitate the installation of tunable radio modules into compact radio assemblies.

Another object is to provide means for readily aligning the tuning shafts of radio assemblies so that the rotary positions of the different shafts are properly related.

Another object is to provide the necessary couplers for installation and alignment without the necessity of allowing space between the modules and the gear train for conventional couplers.

And still another object is to provide easy coupling of the tuning shafts of modules while the associated tuning gear assemblies are constantly enclosed to keep them clean.

The objects and the following description can be more readily understood with reference to the accompanying drawings in which.

Figure 1:
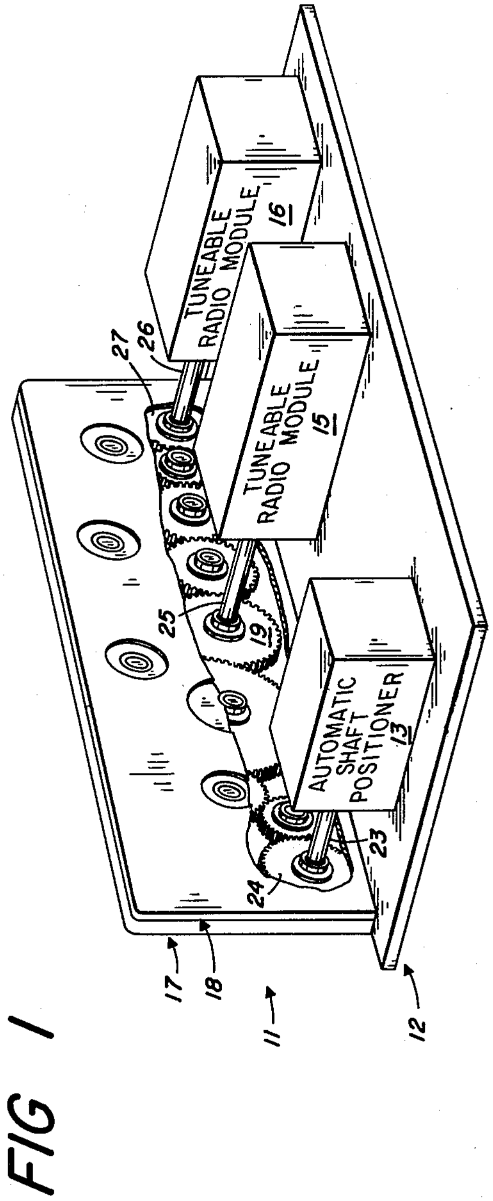
FIGURE 1 is an oblique view of a radio assembly which utilizes the couplers of the present invention.
Figures 2, 3:
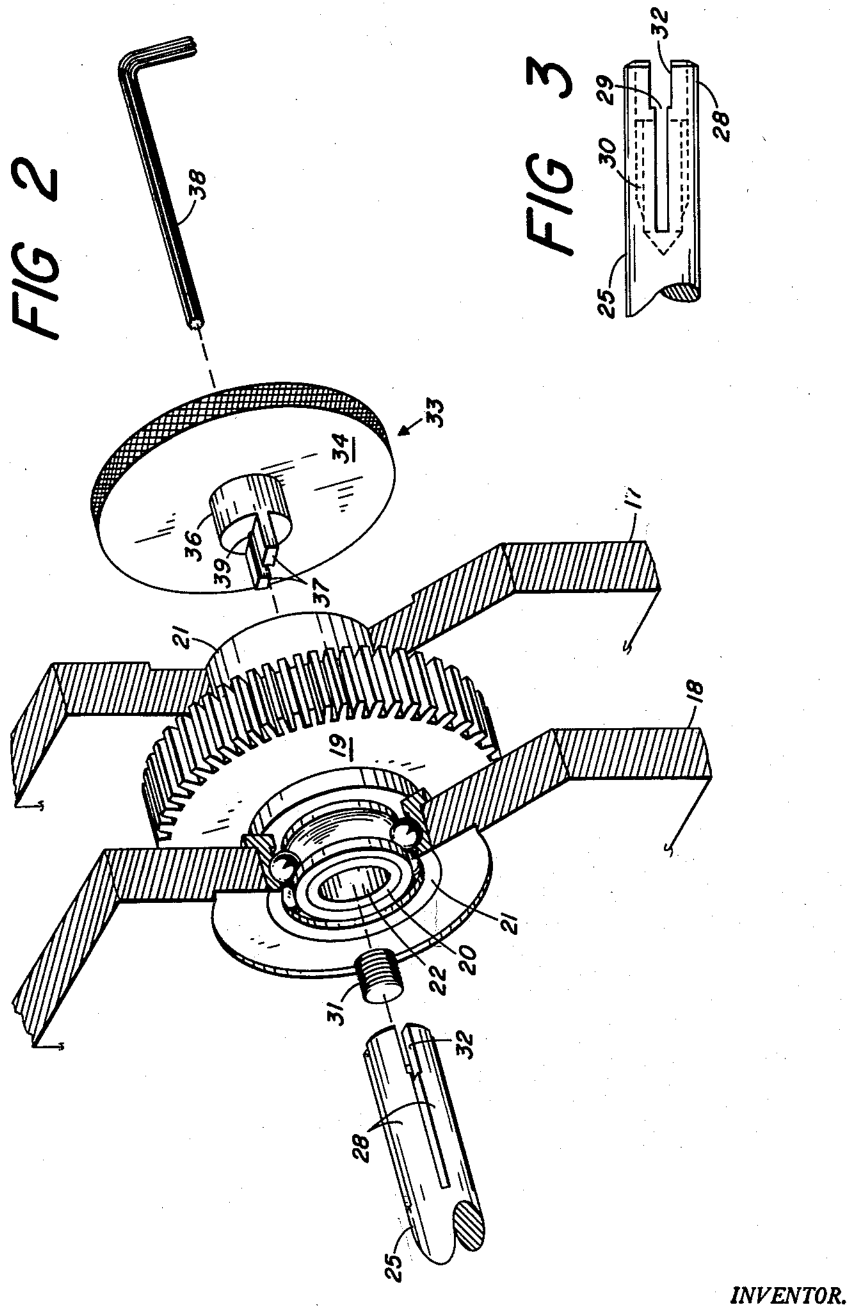
FIGURE 2 shows in detail an exploded coupler to which is applied a tuning tool and a locking tool.
FIGURE 3 is a detailed drawing of that end of a modular tuning shaft which is a portion of the coupler.

The shafts of the driving and the driven units of FIGURE 1 have expandable ends as shown in FIGURE 3. The shafts are coupled to their respective gears of the system shown in FIGURE 1 by inserting their expandable ends into the bores of the respective gears. Each shaft is positioned by application of the tuning tool of FIGURE 2 to the shaft from that side of the gear assembly which is opposite the mounting position of the module. While the shaft is retained in its required rotary position by the tuning tool, a locking tool is inserted through an axial bore of the tuning tool for turning an expansion screw within the end of the shaft. Tightening the locking screw of the shaft securely locks it to its respective gear.

In FIGURE 1, the gear box 11 is mounted to chassis 12 upon which the driving gear assembly and tunable radio modules are to be mounted. The shaft of the automatic shaft positioner 13 and the shafts of tunable radio modules 15–16 engage respective gears within the gear box 11. Each of the gears to which a shaft is to be coupled is in itself part of the coupler for its shaft so that additional space is not required for the coupler. In order to show the couplers more clearly in FIGURE 1, the rear plate of the gear box has been shown partly cutaway, the lengths of the shafts have been exaggerated, and excessive space has been shown between the modules.

The gears in gear box 11 are mounted between the front cover 17 and the rear plate 18. Obviously, the gear box need not be much wider than the width of the gears. Each of the gears such as gear 19 have a pair of hubs 20 which extend from the sides of the gears for mounting in respective roller bearings. The bearings 21 for mounting each gear are inserted in opposite openings in the front cover 17 and in the rear plate 18 of the gear box. Each of the gears in the gear train which are to be coupled directly to tuning shafts, have a cylindrical bore 22 through the axis of the gear for receiving a respective shaft. With reference to FIGURE 1, the automatic shaft positioner 13 is mounted with its shaft 23 inserted into gear 24, and likewise radio modules 15–16 are mounted with their shafts 25–26 coupled to gears 19 and 27 respectively. All of the gears in the gear train are driven by gear 24 which is coupled to the driving assembly.

The projecting ends of the tuning shafts comprise the locking portions of the couplers. The ends are split longitudinally and are bored so that an expanding screw may be inserted from the end of the shaft. More particularly, the shaft 25 of FIGURE 3 is split longitudinally along that portion which is to be inserted into bore 22 of coupling gear 19. The axial bore 29 within the split portion has a tapered thread 30 as shown in FIGURE 3 for receiving the set screw 31. The end of the shaft 25 has slots 32, or other irregular surfaces, to match with the driving portion of a tuning tool.

As the tunable radio module 15 is being mounted in its operating position, the segments 28 of shaft 25 provide a sliding fit in the bore 22 of the hub 20 and gear 19. While the gear 19 is in a predetermined position, the tuning tool 33 is applied to shaft 25 to rotate it as required for tuning the circuits of module 15. The tuning tool 33 has a disc-shaped knob 34 with an axially projecting cylindrical shank 36 which has bits 37 projecting from the end opposite the knob. In order to adjust shaft 25, the shank 36 of the tool 33 is inserted into the bore 22 of gear hub 20 so that the bits 37 engage the slots 32 of the tuning shaft 25.

The shaft is locked by inserting a conventional splined key 38 or screw driver through an axial bore 39 of the shank 36 of the tuning tool in order to engage the socket of the set screw 31. While the shaft is being retained in position by tuning tool 33, the screw 31 is tightened to expand the segments 28 of shaft 25 for forcing the segments tightly against the inside wall of hub 20 of gear 19. A conventional set screw 31 is shown for the locking device. A special locking screw having a conical end which mates with a conical portion on the inner end of the threaded bore 29 of shaft 25 may be used.

Through application of the coupler of this invention, removable radio modules in compact radio equipments may be tuned readily. Access to the shafts for adjustment is provided from that side of the gear train which is opposite to the mounting positions of the modules. Since the end of each of the tuning shafts is inserted directly into the hub of its driving gear, eccentric operation from off-center alignment of the shaft with the gear is eliminated. The range of adjustment for aligning each shaft includes the entire tuning range of that shaft so that no presetting of the shafts is necessary before its module is installed in place of the chassis. The precision gear mechanism for driving the tuning shafts is constantly enclosed during the changing of modules in order to prevent the entrance of foreign particles.

Although this invention has been described with reference to a single embodiment, the locking means for locking a shaft to its coupling gear may be modified in ways that are obvious to those skilled in the art and still be within the scope and spirit of the following claims.

I claim:

1. In a precision rotary shaft positioning system, a gear having an axial hub with external bearing means for rotatably mounting said gear between first and second bearing retaining plates, a shaft and means for coupling said shaft to said gear whereby one extremity of said shaft and said hub form an adjustable coupling means; said coupling means comprising an axial bore formed through said hub to provide a cylindrical inner surface, said extremity of said shaft being round in cross section, split longitudinally, and additionally provided with tapered threaded expanding means, said expanding means being accessible for adjustment by application of screw driving means in line with said shaft, the split end of said shaft being receivable within the axial bore in said hub and while unexpanded having a diameter permitting a slip fit of said shaft extremity within said hub bore, the transverse end surface of the extremity of said shaft being shaped for mating with the end of a tuning tool by means of which said shaft may be rotated, said tuning tool being formed with an axial bore therethrough through which said screw driving means may be concentrically received, and said shaft being capable of being expanded to lock it to said hub bore in response to rotation of said threaded expanding means by said screw driving means as applied through said tuning tool to said expanding means.

2. A shaft coupling means comprising a hub of a gear and the extremity of a shaft, the coupler being readily adjustable to provide accurate rotative positioning of said shaft relative to said gear, said hub having an axial bore therethrough to provide said hub with a cylindrical inner surface, said hub being mounted on its circumference so that both ends thereof are readily accessible, said extremity of said shaft being round in cross section and being split longitudinally to facilitate circumferential expansion, screw means mounted within the end of said split extremity and being adjustable to vary the circumferential expansion of said extremity, said extremity of said shaft being mounted within said inner surface of said hub, said extremity when unexpanded being a sliding fit within said inner surface of said hub, the transverse end face of said extremity being slotted to facilitate mating with a tuning tool of the type formed with a mating projection thereon and by means of which said shaft may be rotated relative to said gear, said tuning tool being formed with an axial bore therethrough through which said screw means is accessible for adjustment to expand said extremity of said shaft for locking adjustment with the inner surface of said hub while said tuning tool is applied to said shaft.

References Cited by the Examiner

UNITED STATES PATENTS

| | | | |
|---|---|---|---|
| 1,400,421 | 12/21 | Colomb | 74—553 X |
| 1,876,287 | 9/32 | Gilbert et al. | 74—10.8 |
| 1,926,798 | 9/33 | Baumboch | 287—20.3 |
| 2,322,947 | 6/43 | Litwin et al. | 287—126 |
| 2,325,691 | 8/43 | Litwin et al. | 287—126 |
| 2,428,218 | 9/47 | Herbst | 74—553 XR |
| 2,469,570 | 5/49 | Parish | 287—52.08 |
| 2,820,396 | 1/58 | Pressey | 74—553 |
| 2,849,891 | 9/58 | Mills | 74—548 X |
| 2,879,673 | 3/59 | Passman | 74—531 |
| 2,913,265 | 11/59 | Lang | 287—52 |

FOREIGN PATENTS

| | | |
|---|---|---|
| 1,105,890 | 7/55 | France. |
| 941,075 | 4/56 | Germany. |
| 693,359 | 7/53 | Great Britain. |
| 122,033 | 6/48 | Sweden. |

OTHER REFERENCES

IBM Technical Disclosure Bulletin, "Capstan Securing Device," A. H. Dahlin, page 9, vol. 4, No. 3, August 1961, copy in 287-53.

1,057,964, May 21, 1959, Germany, printed application.

BROUGHTON G. DURHAM, *Primary Examiner.*